United States Patent
Kim et al.

(10) Patent No.: US 11,512,162 B2
(45) Date of Patent: Nov. 29, 2022

(54) POLYMER, ORGANIC LAYER COMPOSITION AND METHOD OF FORMING PATTERNS

(71) Applicant: SAMSUNG SDI CO., LTD., Yongin-si (KR)

(72) Inventors: Sunghwan Kim, Suwon-si (KR); Yushin Park, Suwon-si (KR); Hyeonil Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 809 days.

(21) Appl. No.: 16/509,804

(22) Filed: Jul. 12, 2019

(65) Prior Publication Data
US 2020/0024384 A1    Jan. 23, 2020

(30) Foreign Application Priority Data
Jul. 18, 2018   (KR) .................. 10-2018-0083636

(51) Int. Cl.
*C08G 8/04*   (2006.01)
*G03F 7/11*   (2006.01)
*C09D 161/06*  (2006.01)

(52) U.S. Cl.
CPC ............ *C08G 8/04* (2013.01); *C09D 161/06* (2013.01); *G03F 7/11* (2013.01)

(58) Field of Classification Search
None
See application file for complete search history.

(56) References Cited

U.S. PATENT DOCUMENTS 9,873,815 B2 * 1/2018 Mun .................. G03F 7/091
2015/0166711 A1   6/2015 Cui et al.

FOREIGN PATENT DOCUMENTS

| CN | 104508558 A | 4/2015 |
| CN | 107797385 A | 3/2018 |
| JP | 2008-547045 A | 12/2008 |

(Continued)

OTHER PUBLICATIONS

Korean Office action dated Aug. 20, 2020.
(Continued)

*Primary Examiner* — Joshua D Zimmerman
(74) *Attorney, Agent, or Firm* — Lee IP Law, P.C.

(57) ABSTRACT

A polymer, an organic layer composition including the polymer, and a method of forming a pattern using the organic layer composition, the polymer including a reaction product of a first compound represented by Chemical Formula 1 and a second compound represented by Chemical Formula 2:

$(CHO)_{n1}$—$Ar^1$—$X$—$Ar^2$—$(CHO)_{n2}$   [Chemical Formula 1]

wherein, in Chemical Formula 1, X is O, S, or NR, in which R is a hydrogen, or a substituted or unsubstituted C1 to C30 alkyl group, $Ar^1$ and $Ar^2$ are independently a substituted or unsubstituted C6 to C30 aromatic ring group, and n1 and n2 are independently an integer of 1 to 3;

$Ar^3$—$(OH)_m$   [Chemical Formula 2]

wherein, in Chemical Formula 2, $Ar^3$ is a substituted or unsubstituted C10 to C30 fused aromatic ring group in which at least two rings are fused, and m is an integer of 1 to 3.

19 Claims, 1 Drawing Sheet

[Calculation Equation 1]

$$\text{Planarization} = \left(1 - \frac{h_2}{h_1}\right) \times 100$$

(56) References Cited

FOREIGN PATENT DOCUMENTS

| | | |
|---|---|---|
| JP | 2015-218333 A | 12/2015 |
| JP | 2017-125182 A | 7/2017 |
| JP | 2018-061034 A | 4/2018 |
| KR | 10-0671115 B1 | 1/2007 |
| KR | 10-0908601 B1 | 7/2009 |
| KR | 10-2009-0120827 A | 11/2009 |
| KR | 10-2012-0060166 A | 6/2012 |
| KR | 10-2014-0039423 A | 4/2014 |
| KR | 10-2015-0002928 A | 1/2015 |
| KR | 10-2015-0069557 A | 6/2015 |
| KR | 10-2016-0107102 A | 9/2016 |
| KR | 10-2016-0110657 A | 9/2016 |
| KR | 10-2017-0087294 A | 7/2017 |
| KR | 10-1812764 B1 | 12/2017 |
| KR | 10-2018-0013104 A | 2/2018 |
| KR | 10-2018-0046236 A | 5/2018 |
| TW | 201249890 A1 | 12/2012 |
| WO | WO 2017/126779 A1 | 7/2017 |

OTHER PUBLICATIONS

Taiwanese Office action dated Sep. 1, 2020.
FengFei, Study on the MEMS Pressure-Sensitive Si-based Diaphragm with Complex Structure and Its Application, 2014.
Ghoshal et al. Nano Research, Oct. 31, 2016, Development of a facile block copolymer method for creating hard mask patterns integrated into semiconductor manufacturing, 2016.
Chinese Notice of Allowance dated Apr. 2, 2022.
Christensen, et al. "Enhanced Photoluminescence of Sulfur-Bridged Organic Chromophores" J. Am. Chem. Soc. 2013.135.8109-8112.

\* cited by examiner

[Calculation Equation 1]
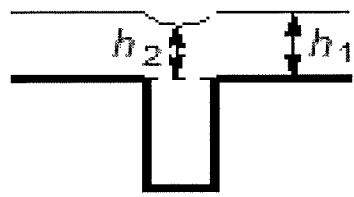
$$\text{Planarization} = \left(1 - \frac{h_2}{h_1}\right) \times 100$$

POLYMER, ORGANIC LAYER COMPOSITION AND METHOD OF FORMING PATTERNS

CROSS-REFERENCE TO RELATED APPLICATION

Korean Patent Application No. 10-2018-0083636, filed on Jul. 18, 2018, in the Korean Intellectual Property Office, and entitled: "Polymer, Organic Layer Composition and Method of Forming Patterns," is incorporated by reference herein in its entirety.

BACKGROUND

1. Field

Embodiments relate to a polymer, an organic layer composition including the polymer, and a method of forming patterns using the organic layer composition.

2. Description of the Related Art

Recently, the semiconductor industry has developed to an ultra-fine technique having a pattern of several to several tens of nanometer size. Such ultrafine technique may use effective lithographic techniques.

SUMMARY

The embodiments may be realized by providing a polymer including a reaction product of a first compound represented by Chemical Formula 1 and a second compound represented by Chemical Formula 2:

$(CHO)_{n1}$—$Ar^1$—X—$Ar^2$—$(CHO)_{n2}$ [Chemical Formula 1]

wherein, in Chemical Formula 1, X is O, S, or NR (in which R may be a hydrogen, or a substituted or unsubstituted C1 to C30 alkyl group), $Ar^1$ and $Ar^2$ are independently a substituted or unsubstituted C6 to C30 aromatic ring group, and n1 and n2 are independently an integer of 1 to 3;

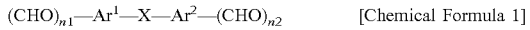

$Ar^3$—$(OH)_m$ [Chemical Formula 2]

wherein, in Chemical Formula 2, $Ar^3$ is a substituted or unsubstituted C10 to C30 fused aromatic ring group in which at least two rings are fused, and m is an integer of 1 to 3.

$Ar^1$ and $Ar^2$ may independently be a substituted or unsubstituted C10 to C30 fused aromatic ring group in which at least two rings are fused.

$Ar^1$ and $Ar^2$ may independently be a substituted or unsubstituted C14 fused aromatic ring group in which three rings are fused, a substituted or unsubstituted C16 to C18 fused aromatic ring group in which four rings are fused, or a combination thereof.

The first compound may be unsubstituted or is substituted with a hydroxy group or a C1 to C5 alkoxy group.

n1 and n2 may both be 1.

The first compound may be represented by Chemical Formula 1-1 or Chemical Formula 1-2:

[Chemical Formula 1-1]

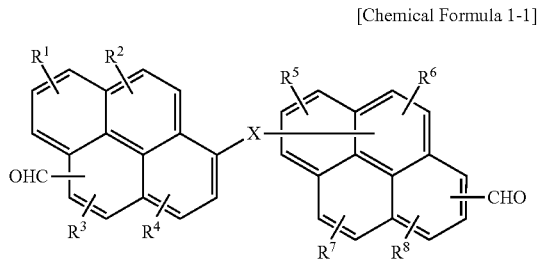

[Chemical Formula 1-2]

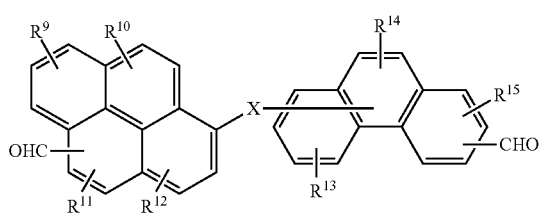

wherein, in Chemical Formula 1-1 and 1-2, X may be O, S, or NR (in which R may be a hydrogen, or a substituted or unsubstituted C1 to C30 alkyl group), and $R^1$ to $R^{15}$ may independently be hydrogen, a hydroxy group, or a C1 to C5 alkoxy group.

The first compound may be a compound of Group 1:

[Group 1]

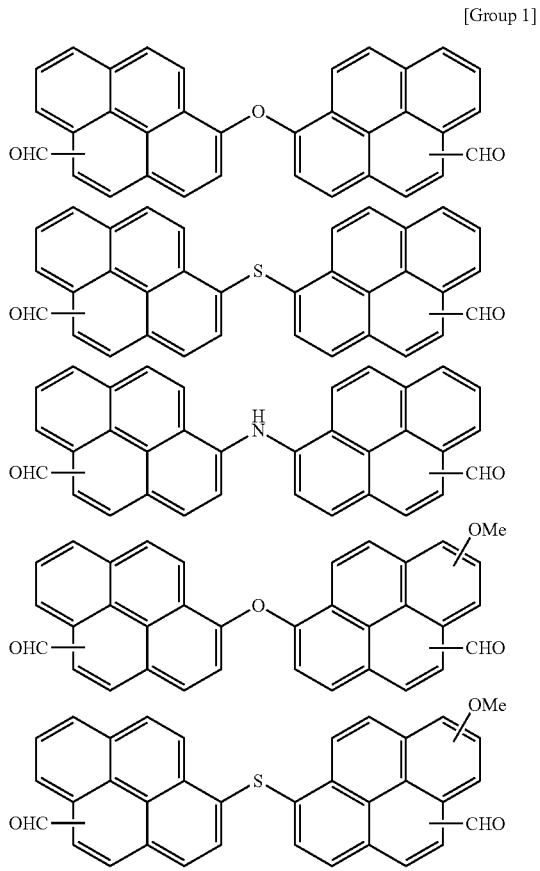

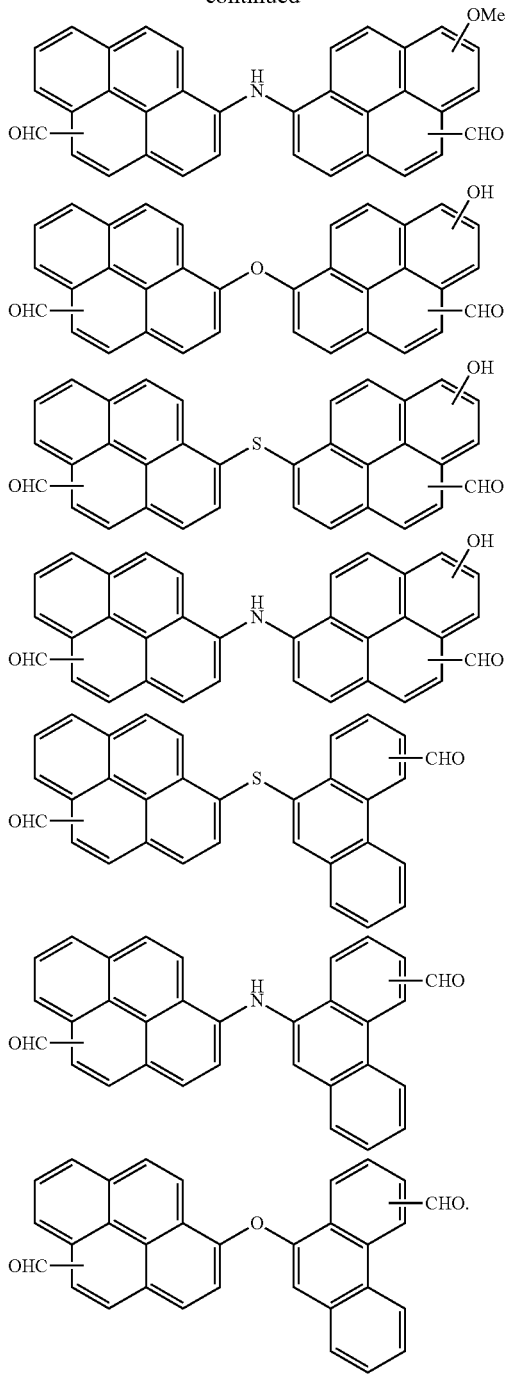

Ar¹ and Ar² may independently be a substituted or unsubstituted C14 fused aromatic ring group in which three rings are fused, a substituted or unsubstituted C16 to C18 fused aromatic ring group in which four rings are fused, or a combination thereof.

The first compound may be unsubstituted or is substituted with a hydroxy group or a C1 to C5 alkoxy group.

n1 and n2 may both be 1.

The first compound may be represented by Chemical Formula 1-1 or Chemical Formula 1-2:

[Chemical Formula 1-1]

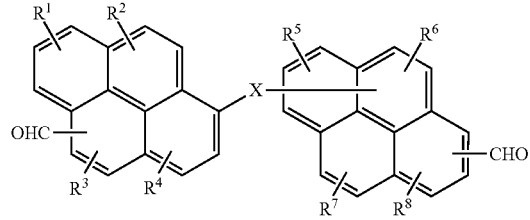

[Chemical Formula 1-2]

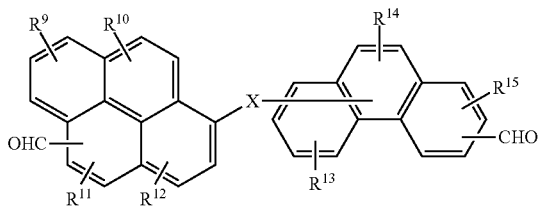

wherein, in Chemical Formula 1-1 and 1-2, X may be O, S, or NR (in which R may be a hydrogen, or a substituted or unsubstituted C1 to C30 alkyl group), and $R^1$ to $R^{15}$ may independently be hydrogen, a hydroxy group, or a C1 to C5 alkoxy group.

The first compound may be a compound of Group 1:

[Group 1]

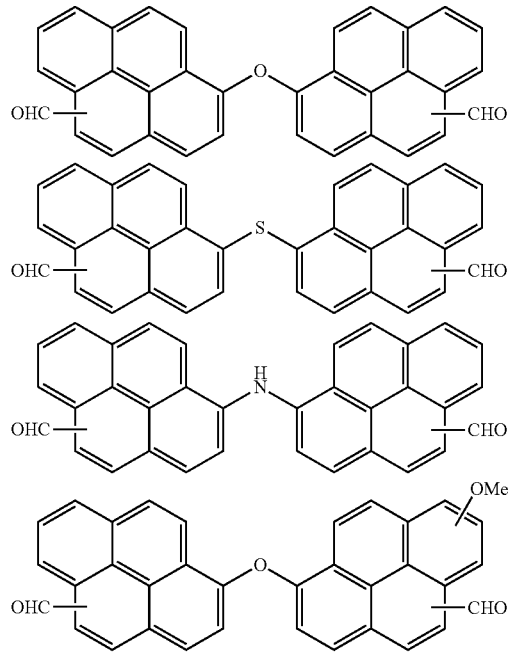

Ar³ may be a substituted or unsubstituted naphthyl group, a substituted or unsubstituted anthracenyl group, a substituted or unsubstituted phenanthrenyl group, a substituted or unsubstituted triphenylene group, a substituted or unsubstituted pyrenyl group, or a combination thereof.

A weight average molecular weight of the polymer may be about 1,500 to about 4,000.

The embodiments may be realized by providing an organic layer composition including the polymer according to an embodiment, and a solvent.

Ar¹ and Ar² may independently be a substituted or unsubstituted C10 to C30 fused aromatic ring group in which at least two rings are fused.

-continued

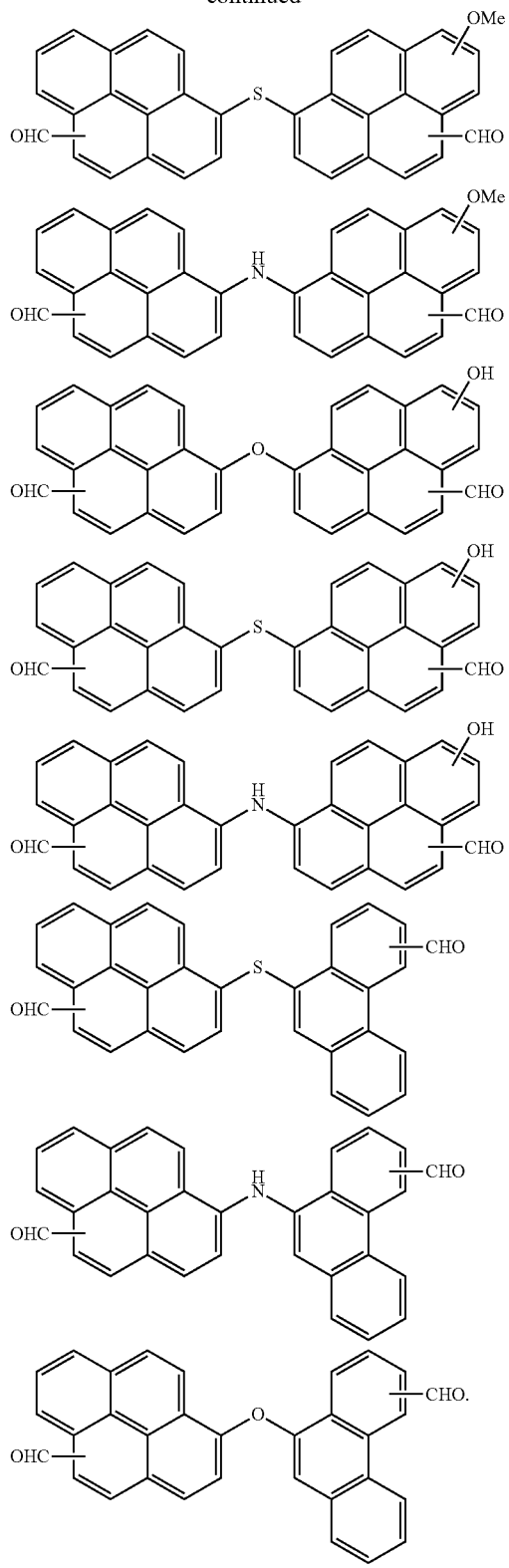

Ar³ may be a substituted or unsubstituted naphthyl group, a substituted or unsubstituted anthracenyl group, a substituted or unsubstituted phenanthrenyl group, a substituted or unsubstituted triphenylene group, a substituted or unsubstituted pyrenyl group, or a combination thereof.

A weight average molecular weight of the polymer may be about 1,500 to about 4,000.

The embodiments may be realized by providing a method of forming patterns, the method including providing a material layer on a substrate, applying the organic layer composition according to an embodiment on the material layer, heat-treating the organic layer composition to form a hardmask layer, forming a photoresist layer on the hardmask layer, exposing and developing the photoresist layer to form a photoresist pattern, selectively removing the hardmask layer using the photoresist pattern to expose a part of the material layer, and etching an exposed part of the material layer.

BRIEF DESCRIPTION OF THE DRAWING

Features will be apparent to those of skill in the art by describing in detail exemplary embodiments with reference to the attached drawing in which:

The FIGURE illustrates Calculation Equation 1 for tabulating planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when a definition is not otherwise provided, 'substituted' may refer to replacement of a hydrogen atom of a compound by a substituent selected from a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heteroaryl group, and a combination thereof.

As used herein, when a definition is not otherwise provided, 'hetero' may refer to one including 1 to 3 heteroatoms selected from N, O, S, and P.

As used herein, "aryl group" may refer to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic, or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, the substituted or unsubstituted aryl group and/or the substituted or unsubstituted heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazolyl group, pyridoindolyl group, benzopyridooxazinyl group, benzopyridothiazinyl group, 9,9-dimethyl-9,10-dihydroacridinyl group, a combination thereof, or a combined fused ring of the foregoing groups. In an implementation, the heterocyclic group or the heteroaryl group may be an imidazolyl group, a thiophenyl group, a pyridyl group, a pyrimidinyl group, or an indolyl group.

As used herein, "fused ring group" may refer to (i) a cyclic group formed by fusing two or more benzene rings, (ii) a cyclic group formed by fusing two or more C5 to C8 aliphatic cyclic groups, or (iii) a cyclic group formed by fusing one or two or more benzene rings and one or more C5 to C8 aliphatic cyclic groups. For example, the fused ring group may be a "fused aromatic ring group" including at least two substituted or unsubstituted benzene rings in its structure. In an implementation, the fused aromatic ring group may be, e.g., naphthalene, anthracene, phenanthrene, pyrene, perylene, benzoperylene, and coronene.

Hereinafter, a polymer according to an embodiment is described.

A polymer according to an embodiment may include a reaction product of a first compound represented by Chemical Formula 1 and a second compound represented by Chemical Formula 2. For example, the polymer may include repeating units of a monomer represented by Chemical Formula 1 and repeating units of a monomer represented by Chemical Formula 2.

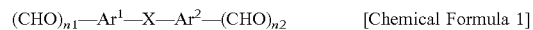

$(CHO)_{n1}$—$Ar^1$—X—$Ar^2$—$(CHO)_{n2}$  [Chemical Formula 1]

In Chemical Formula 1,

X may be, e.g., O, S, or NR (in which R may be a hydrogen, or a substituted or unsubstituted C1 to C30 alkyl group), $Ar^1$ and $Ar^2$ may each independently be or include, e.g., a substituted or unsubstituted C6 to C30 aromatic ring group, and n1 and n2 may each independently be, e.g., an integer of 1 to 3.

$Ar^3$—$(OH)_m$  [Chemical Formula 2]

In Chemical Formula 2, $Ar^3$ may be or may include, e.g., a substituted or unsubstituted C10 to C30 fused aromatic ring group which at least two rings are fused, and m may be, e.g., an integer of 1 to 3.

In an implementation, the first compound represented by Chemical Formula 1 may include an aromatic ring including at least two aldehyde groups in the molecule. In an implementation, the second compound is represented by Chemical Formula 2 may include a fused aromatic ring including a hydroxy group in the molecule.

For example, the compound including the aromatic ring including aldehyde groups and the compound including the fused aromatic ring including the hydroxy group may be used as monomers so that a polymer having strong heat resistance and etch resistance may be synthesized. For example, a hardmask composition having improved solubility and adherence to a lower layer due to influences of the hydroxy group and tertiary C—H (methine hydrogen) present in the compound may be prepared.

The reaction product according to an embodiment may be prepared by reacting aldehyde of the first compound with the second compound in the presence of an acid catalyst in a suitable solvent.

The acid catalyst may include a suitable acid catalyst. In an implementation, the acid catalyst may include, e.g., HCl, HBr, $HNO_3$, $H_2SO_4$, $H_3PO_4$, methanesulfonic acid, ethanesulfonic acid, phenylsulfonic acid, phenol sulfonic acid, para-toluene sulfonic acid (pTSA), or the like.

In an implementation, the solvent may include, e.g., alcohol, glycol ether, lactone, ester, water, or aromatic hydrocarbon. In an implementation, a relatively polar solvent, e.g., alcohol, glycol ether, lactone, ester, water, or a mixture thereof, may be used. Examples of the solvent may include methanol, ethanol, propanol, propylene glycol, propylene glycol methyl ether, propylene glycol dimethyl ether, diethylene glycol dimethyl ether, propylene glycol methyl ether acetate (PGMEA), gamma-butyrolactone (GBL), gamma-valerolactone, delta-valerolactone, ethyl lactate, water, mesitylene, xylene, anisole, 4-methylanisole, and the like. In an implementation, the solvent may include, e.g., methanol, ethanol, propanol, propylene glycol, propylene glycol methyl ether, propylene glycol dimethyl ether, propylene glycol methyl ether acetate, gamma-butyrolactone, gamma-valerolactone, delta-valerolactone, ethyl lactate, water, or the like.

In an implementation, in the first compound, Ar$^1$ and Ar$^2$ may each independently be or include, e.g., a substituted or unsubstituted C10 to C30 fused aromatic ring group in which at least two rings are fused.

In an implementation, Ar$^1$ and Ar$^2$ may each independently be or include, e.g., a substituted or unsubstituted C14 fused aromatic ring group in which three rings are fused, a substituted or unsubstituted C16 to C18 fused aromatic ring group in which four rings are fused, or a combination thereof.

In an implementation, Ar$^1$ and Ar$^2$ may each independently be or include, e.g., a substituted or unsubstituted anthracenyl group, a substituted or unsubstituted phenanthrenyl group, a substituted or unsubstituted pyrenyl group, a substituted or unsubstituted triphenylene group, or a combination thereof.

In an implementation, the first compound may be unsubstituted or may be substituted with, e.g., a hydroxy group and a C1 to C5 alkoxy group.

In an implementation, the first compound may be represented by, e.g., Chemical Formula 1-1 or Chemical Formula 1-2.

[Chemical Formula 1-1]

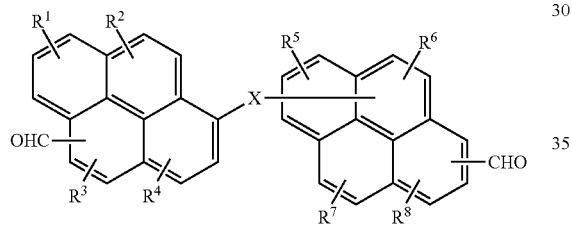

[Chemical Formula 1-2]

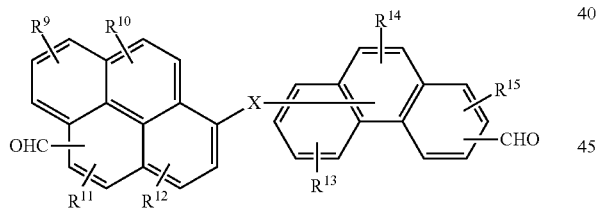

In Chemical Formula 1-1 and 1-2,

X may be, e.g., O, S, or NR (in which R may be a hydrogen, or a substituted or unsubstituted C1 to C30 alkyl group), and R$^1$ to R$^{15}$ may each independently be, e.g., hydrogen, a hydroxy group, or a C1 to C5 alkoxy group.

In an implementation, the first compound may be a compound of the following Group 1.

[Group 1]

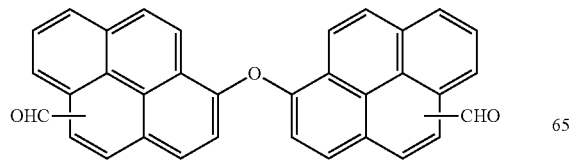

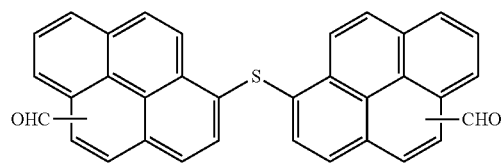

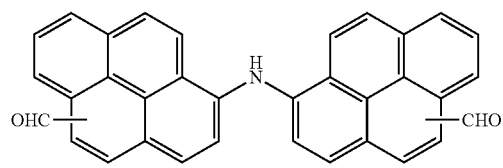

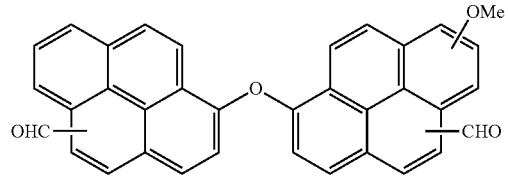

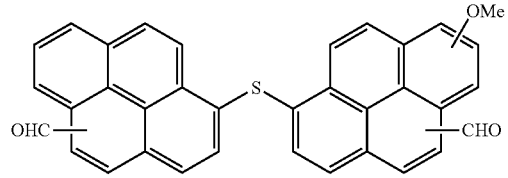

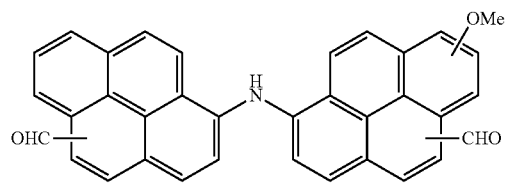

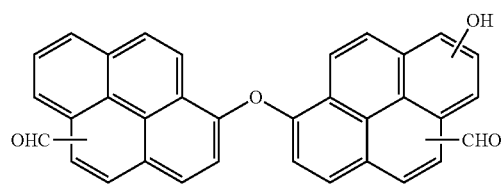

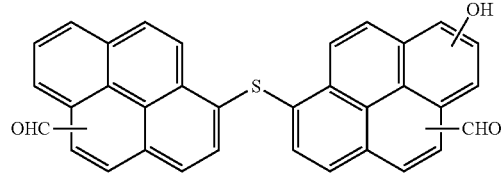

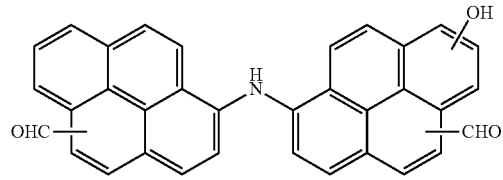

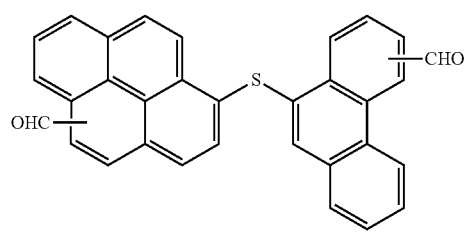

-continued

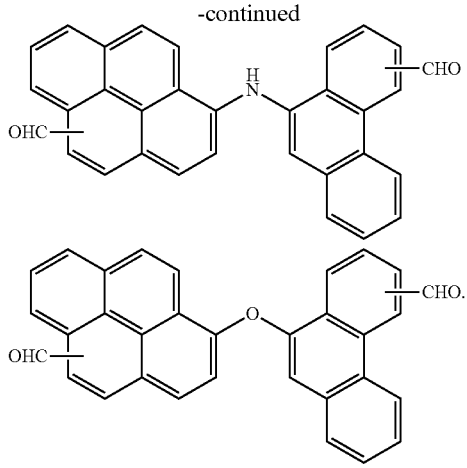

Ar³ of the second compound may be or may include, e.g., a substituted or unsubstituted naphthyl group, a substituted or unsubstituted anthracenyl group, a substituted or unsubstituted phenanthrenyl group, a substituted or unsubstituted triphenylene group, a substituted or unsubstituted pyrenyl group, or a combination thereof.

In an implementation, Ar³ may be or may include, e.g., a substituted or unsubstituted pyrenyl group.

In an implementation, the polymer may have a weight average molecular weight of about 1,500 to about 4,000, e.g., about 1,800 to about 3,600.

When the weight average molecular weight is within the ranges, it may be possible to optimize a carbon content and a solubility for a solvent of an organic layer composition including the polymer (e.g., hardmask composition).

In an implementation, a third compound may be further reacted with the first compound and the second compound to produce a reaction product, e.g., a polymer.

In an implementation, the third compound may include, e.g., indole, carbazole, triphenylamine, benzofuran, or the like.

Another embodiment may provide an organic layer composition including, e.g., the aforementioned polymer and a solvent.

The solvent may be a suitable solvent having sufficient dissolubility or dispersibility with respect to the polymer. In an implementation, the solvent may include, e.g., propylene glycol, propylene glycol diacetate, methoxy propanediol, diethylene glycol, diethylene glycol butyl ether, tri(ethylene glycol)monomethylether, propylene glycol monomethylether, propylene glycol monomethylether acetate, cyclohexanone, ethyl lactate, gamma-butyrolactone, N,N-dimethyl formamide, N,N-dimethyl acetamide, methyl pyrrolidone, methyl pyrrolidinone, acetylacetone, or ethyl 3-ethoxypropionate.

In an implementation, the polymer may be included in an amount of, e.g., about 0.1 to about 30.0 wt %, about 2.0 to about 20.0 wt %, or about 5.0 to 15.0 wt %, based on a total weight of the organic layer composition. When the polymer is included within the range, a thickness, surface roughness and planarization of the hardmask may be controlled.

In an implementation, the organic layer composition may further include an additive, e.g., a surfactant, a cross-linking agent, a thermal acid generator, or a plasticizer.

In an implementation, the surfactant may include, e.g., a fluoroalkyl compound, an alkylbenzene sulfonate salt, an alkyl pyridinium salt, polyethylene glycol, or a quaternary ammonium salt.

In an implementation, the cross-linking agent may include, e.g., a melamine cross-linking agent, substituted urea cross-linking agent, or a polymer cross-linking agent. In an implementation, it may be a cross-linking agent having at least two cross-linking forming substituents, e.g., methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, butoxymethylated thiourea, or the like.

The cross-linking agent may be a cross-linking agent having high heat resistance. The cross-linking agent having high heat resistance may be a compound including a cross-linking substituent including an aromatic ring (e.g., a benzene ring, or a naphthalene ring) in the molecule.

In an implementation, the thermal acid generator may include an acidic compound, e.g., p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organosulfonic acid alkylester, or the like.

In an implementation, the additive may be included in an amount of, e.g., about 0.001 to about 40 parts by weight, based on 100 parts by weight of the organic layer composition. Within the ranges, solubility may be improved while optical properties of the organic layer composition are not (e.g., adversely) changed.

According to another embodiment, an organic layer manufactured using the aforementioned organic layer composition may be provided. The organic layer may be, e.g., formed by coating the aforementioned organic layer composition on a substrate and heat-treating it for curing and may include, e.g., a hardmask layer, a planarization layer, a sacrificial layer, a filler, and the like for an electronic device.

Hereinafter, a method of forming patterns using the aforementioned organic layer composition is described.

A method of forming patterns according to an embodiment may include providing a material layer on a substrate, applying the organic layer composition including the polymer and the solvent on the material layer, heat-treating the organic layer composition to form a hardmask layer, forming a photoresist layer on the hardmask layer, exposing and developing the photoresist layer to form a photoresist pattern, selectively removing the hardmask layer using the photoresist pattern to expose a part of the material layer, and etching an exposed part of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through, e.g., a chemical vapor deposition (CVD) process.

The organic layer composition is the same as described above, and may be applied by spin-on coating in a form of a solution. In an implementation, a thickness of the applied organic layer composition may be, e.g., about 50 to 200,000 Å.

The heat-treating of the organic layer composition may be performed, e.g., at about 100° C. to 700° C. for about 10 seconds to 1 hour.

In an implementation, the method may further include forming a silicon-containing thin layer on the hardmask layer. The silicon-containing thin layer may be formed of, e.g., SiCN, SiOC, SiON, SiOCN, SiC, SiO, SiN, or the like.

In an implementation, the method may further include forming a bottom antireflective coating (BARC) on the upper surface of the silicon-containing thin layer or on the upper surface hardmask layer before forming the photoresist layer.

Exposure of the photoresist layer may be performed using, e.g., ArF, KrF, or EUV. After exposure, heat-treating may be performed at, e.g., about 100° C. to 700° C.

The etching process of the exposed part of the material layer may be performed through a dry etching process using an etching gas and the etching gas may be, e.g., $CHF_3$, $CF_4$, $Cl_2$, $BCl_3$, or a mixed gas thereof.

The etched material layer may be formed in a plurality of patterns, and the plurality of patterns may be a metal pattern, a semiconductor pattern, an insulation pattern, or the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of First Compound

Synthesis Example 1: Synthesis of Compound 1

$1^{st}$ Step: Synthesis of Compound 1a

Hydroxypyrene (43.6 g, 0.2 mol) and bromopyrene (28.1 g, 0.1 mol) were dissolved in 200 mL of pyridine in a flask, $K_3PO_4$ (42.5 g, 0.2 mol) and CuO (11.9 g, 0.15 mol) were added thereto, and the mixture was stirred at 120° C. for 40 hours.

When a reaction was complete, 300 mL of ethyl acetate was added thereto to dilute the reactants, the diluted reactants were washed with 200 mL of DIW (deionized water), and an organic layer was separated therefrom. After removing an organic solvent under a reduced pressure, Compound 1a was obtained through column chromatography.

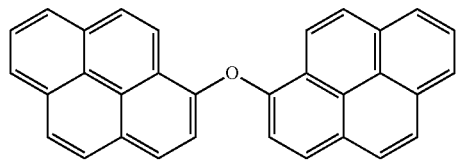

<Compound 1a>

$2^{nd}$ Step: Synthesis of Compound 1

Compound 1a (20.9 g, 0.05 mol) was dissolved in 150 ml of dimethyl formamide, $POCl_3$ (30.7 g, 0.2 mol) was slowly added thereto at 0° C. over 30 minutes, and the mixture was stirred at 70° C. for 10 hours.

When a reaction was complete, the reactants were cooled down to ambient temperature and slowly added to DIW (1,000 mL) over 30 minutes. A solid obtained therefrom was filtered and washed with DIW (1,000 mL), and an organic solvent was removed therefrom under a reduced pressure to obtain Compound 1.

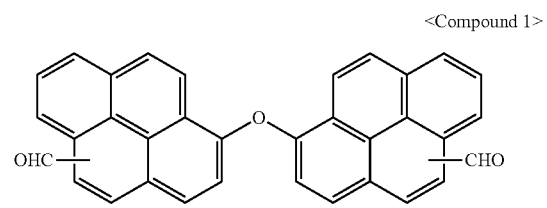

<Compound 1>

Synthesis Example 2: Synthesis of Compound 2

Compound 2 was obtained according to the same method as Synthesis Example 1 except that aminopyrene was used instead of hydroxypyrene.

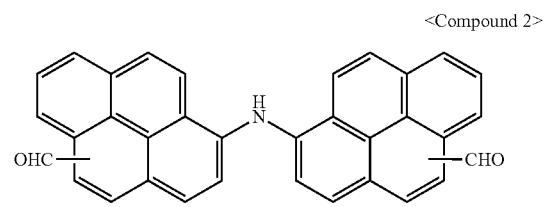

<Compound 2>

Synthesis Example 3: Synthesis of Compound 3

Compound 3 was obtained according to the same method as Synthesis Example 1 except that 9-hydroxyphenanthrene was used instead of hydroxypyrene.

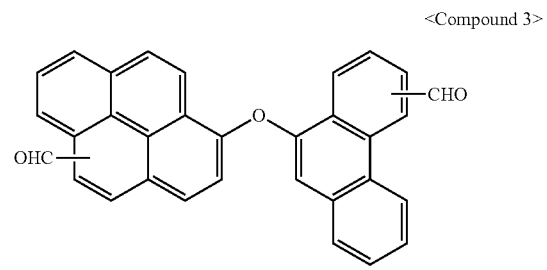

<Compound 3>

Synthesis Example 4: Synthesis of Compound 4

$1^{st}$ Step: Synthesis of Compound 4a

Methoxypyrene (23.2 g, 0.1 mol) was put in a flask and dissolved in 200 mL of acetic acid, HBr (6 mL) was slowly added thereto at ambient temperature, and the mixture was additionally stirred for 1 hour.

When a reaction was complete, the reactants were slowly added to DIW (1,000 mL) over 30 minutes. A solid obtained therefrom was filtered and washed with DIW (1,000 mL), an organic solvent was removed therefrom under a reduced pressure, and Compound 4a was obtained through column chromatography.

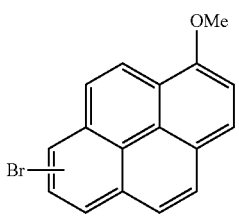

<Compound 4a>

2<sup>nd</sup> Step: Synthesis of Compound 4

Compound 4 was obtained according to the same method as Synthesis Example 1 except that Compound 4a was used instead of bromopyrene.

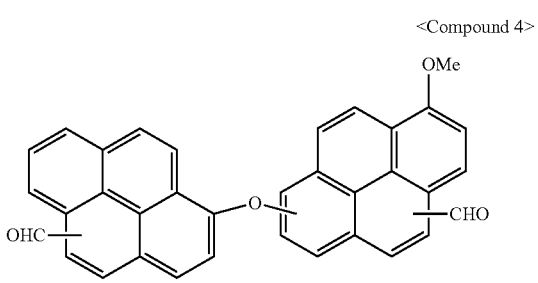

<Compound 4>

Synthesis Example 5: Synthesis of Compound 5

Compound 4 (23.7 g, 0.05 mol) was put in a flask and dissolved in 150 mL of NMP, KOH (11.2 g, 0.2 mol) and 1-dodecanethiol (20.2 g, 0.1 mol) were added thereto, and the mixture was stirred at 130° C. for 8 hours.

When a reaction was complete, the reactants were cooled down to ambient temperature and then, slowly added to 500 mL of an ammonium chloride aqueous solution over 30 minutes. A solid obtained therefrom was filtered and washed with DIW (1,000 mL), and an organic solvent was removed therefrom under a reduced pressure to obtain Compound 5 through column chromatography.

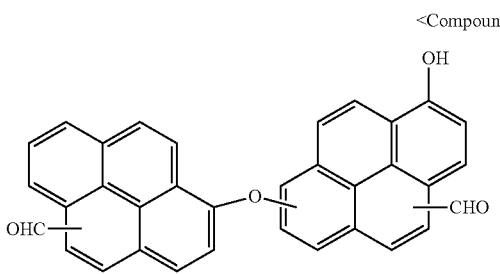

<Compound 5>

Synthesis of Polymer

Example 1: Synthesis of Resin 1

Compound 1 (23.7 g, 0.05 mol) and hydroxypyrene (21.8 g, 0.1 mol) were put in a flask and dissolved in 100 mL of propylene glycol methyl ether acetate (PGMEA), p-toluene sulfonic acid (9.5 g, 0.05 mol) was slowly added thereto at ambient temperature, and the mixture was stirred at 110° C. for 10 hours.

When a reaction was complete, the resultants were cooled down to ambient temperature, and precipitated in MeOH to remove oligomer and vacuum-dried to obtain Resin 1 having a weight average molecular weight of 3,000.

Example 2: Synthesis of Resin 2

Resin 2 (having a weight average molecular weight of 2,700) was obtained according to the same method as Example 1 except that Compound 2 was used instead of Compound 1.

Example 3: Synthesis of Resin 3

Resin 3 (having a weight average molecular weight of 2,000) was obtained according to the same method as Example 1 except that Compound 3 was used instead of Compound 1.

Example 4: Synthesis of Resin 4

Resin 4 (having a weight average molecular weight of 2,300) was obtained according to the same method as Example 1 except that Compound 4 was used instead of Compound 1.

Example 5: Synthesis of Resin 5

Resin 5 (having a weight average molecular weight of 3,600) was obtained according to the same method as Example 1 except that Compound 5 was used instead of Compound 1.

Example 6: Synthesis of Resin 6

Resin 6 (having a weight average molecular weight of 2,600) was obtained according to the same method as Example 1 except that indole was additionally used in addition to Compound 1 and hydroxypyrene.

Example 7: Synthesis of Resin 7

Resin 7 (having a weight average molecular weight of 3,100) was obtained according to the same method as Example 6 except that Compound 4 was added instead of Compound 1.

Example 8: Synthesis of Resin 8

Resin 8 (having a weight average molecular weight of 3,400) was obtained according to the same method as Example 6 except that Compound 5 was added instead of Compound 1.

Comparative Example 1: Synthesis of Comparative Resin 1

28.83 g (0.2 mol) of 1-naphthol, 41.4 g (0.15 mol) of benzoperylene, and 12.0 g (0.34 mol) of paraformaldehyde were put in a flask, and 162 g of propylene glycol methyl ether acetate (PGMEA) was added thereto. Subsequently, 0.19 g of p-toluene sulfonic acid monohydrate was added thereto, and the mixture was stirred at 90 to 100° C. for 5 to 12 hours.

A sample was taken from the polymerization reactant by every hour, and a weight average molecular weight of the sample was measured to complete a reaction, when the weight average molecular weight of the sample was in a range of 1,800 to 2,500.

When the polymerization reaction was complete, the reactants were slowly cooled down to ambient temperature, 40 g of distilled water and 400 g of methanol were added thereto, and the mixture was fervently stirred and allowed to stand.

After removing a supernatant therefrom, a precipitate therein was dissolved in 80 g of propylene glycol methyl ether acetate (PGMEA), and the solution was vigorously stirred by using 320 g of methanol and then, allowed to stand (a first process). Subsequently, a supernatant obtained herein was removed again, and a precipitate obtained therefrom was dissolved in 80 g of propylene glycol methyl ether acetate (PGMEA) (a second process). The first and second processes are regarded as one purification process, which was repeated three times. A polymer obtained after the purification was dissolved in 80 g of propylene glycol methyl ether acetate (PGMEA), and the methanol and the distilled water remaining in the solution were removed under a reduced pressure to obtain Comparative Resin 1 having a weight average molecular weight of 3,200.

<Comparative Resin 1>

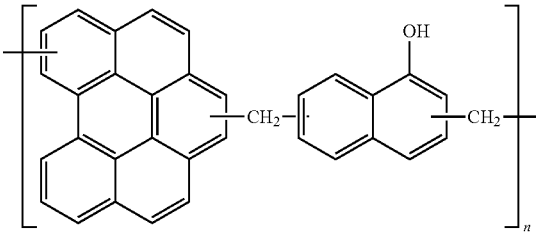

Comparative Example 2: Synthesis of Comparative Resin 2

1-Pyrenecarboxaldehyde (23.0 g, 0.1 mol) and 1-hydroxypyrene (21.8 g, 0.1 mol) were put in a flask, and 50 g of propylene glycol methyl ether acetate (PGMEA) was added thereto to prepare a solution 1.10 g (7.13 mmol) of diethyl sulfate was added to the solution, and the mixture was stirred at 100° C. for 24 hours. When a polymerization was complete, the resultant was precipitated in methanol to remove monomers and low molecular-weight polymers and to obtain Comparative Resin 2 having a weight average molecular weight of 1,800.

<Comparative Resin 2>

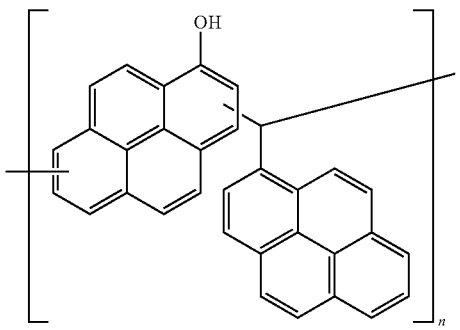

(Preparation of Hardmask Composition)

1 g of each resin according to Examples 1 to 8 and Comparative Examples 1 and 2 were respectively dissolved in 10 g of a solution prepared by mixing propylene glycol methyl ether acetate and cyclohexane in a volume ratio of 1:1, and the obtained solution was stirred for 24 hours and filtered through a 0.1 μm filter to prepare a hardmask compositions.

(Evaluation)

Evaluation 1: Etch Resistance

The hardmask compositions were respectively coated on a silicon wafer (5 to 20% of a solid in PGMEA or PGMEA/ANONE) and heat-treated on a hot plate at 400° C. for 2 minutes to form 4,000 Å-thick thin films, and each thickness of the thin films was measured by a thin film thickness-measuring instrument made by K-MAC. Subsequently, the thin films were respectively dry-etched by using $CF_x$ mixed gas and $N_2O_2$ mixed gas to secure their etch resistance results, and the results are shown in Table 1.

TABLE 1

| | Bulk etch rate (Å/sec) | |
|---|---|---|
| Samples | $N_2O_2$ etch | $CF_x$ etch |
| Example 1 | 23.6 | 24.9 |
| Example 2 | 22.8 | 26.2 |
| Example 3 | 25.0 | 24.3 |
| Example 4 | 24.3 | 23.5 |
| Example 5 | 21.4 | 23.2 |
| Example 6 | 23.7 | 22.7 |
| Example 7 | 20.8 | 22.9 |
| Example 8 | 21.2 | 22.3 |
| Comparative Example 1 | 25.9 | 27.3 |
| Comparative Example 2 | 24.8 | 26.2 |

*Bulk Etch Rate = {(initial thin film thickness) − (thin film thickness after etching)}/(etching time)

Evaluation 2: Planarization Characteristics and Gap-Fill Characteristics

The hardmask compositions according to Examples 1 to 8 and Comparative Examples 1 and 2 were respectively coated on a patterned wafer and baked on a hot plate to form thin films, and a scanning electron microscope (SEM) was used to examine gap-fill characteristics and planarization performance of the films.

The gap-fill characteristics were evaluated depending on whether a void was generated or not by examining the cross sections of the patterns with a scanning electronic microscope (SEM) and the planarization characteristics were evaluated by measuring thicknesses of the thin films around the patterns and calibrated with Calculation Equation 1 of the FIGURE using a thin film thickness measurement device of K-MAC. As the difference between h1 and h2 is smaller, the planarization becomes better.

The planarization characteristics and the gap-fill characteristics of each film are shown in Table 2.

TABLE 2

| | Planarization characteristics ($h_1$-$h_2$, Å) | | Gap-fill characteristics |
|---|---|---|---|
| | aspect ratio (1:2) | aspect ratio (1:10) | (void were generated or not) |
| Example 1 | 85 | 163 | no void |
| Example 2 | 98 | 171 | no void |
| Example 3 | 103 | 203 | no void |
| Example 4 | 79 | 193 | no void |
| Example 5 | 90 | 184 | no void |
| Example 6 | 93 | 158 | no void |
| Example 7 | 88 | 129 | no void |

TABLE 2-continued

| | Planarization characteristics $(h_1-h_2, Å)$ | | Gap-fill characteristics |
|---|---|---|---|
| | aspect ratio (1:2) | aspect ratio (1:10) | (void were generated or not) |
| Example 8 | 71 | 143 | no void |
| Comparative Example 1 | 118 | 303 | voids are generated |
| Comparative Example 2 | 101 | 210 | voids are generated |

By way of summation and review, according to small sizes of patterns to be formed, it may be difficult to provide a fine pattern having an excellent profile by using some other lithographic techniques.

One lithographic technique may include providing a material layer on a semiconductor substrate; coating a photoresist layer thereon; exposing and developing the same to provide a photoresist pattern; and etching a material layer using the photoresist pattern as a mask.

An organic layer, called a hardmask layer, may be formed between the material layer and the photoresist layer to provide a fine pattern.

The hardmask layer may play a role of an intermediate layer for transferring the fine pattern of photoresist to the material layer through the selective etching process. For example, the hardmask layer may have characteristics such as heat resistance and etch resistance to be tolerated during the multiple etching processes.

One or more embodiments may provide a polymer that may be effectively applicable to a hardmask layer.

The organic film composition according to an embodiment may have improved planarization characteristics and gap-fill characteristics at the time of application by a spin-coating method while securing etch resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer comprising a reaction product of a first compound represented by Chemical Formula 1 and a second compound represented by Chemical Formula 2:

$(CHO)_{n1}—Ar^1—X—Ar^2—(CHO)_{n2}$ [Chemical Formula 1]

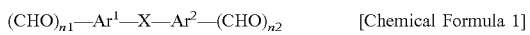

wherein, in Chemical Formula 1,
X is O, S, or NR, in which R is a hydrogen, or a substituted or unsubstituted C1 to C30 alkyl group,
$Ar^1$ and $Ar^2$ are independently a substituted or unsubstituted C6 to C30 aromatic ring group, and
n1 and n2 are independently an integer of 1 to 3;

$Ar^3—(OH)_m$ [Chemical Formula 2]

wherein, in Chemical Formula 2,
$Ar^3$ is a substituted or unsubstituted C10 to C30 fused aromatic ring group in which at least two rings are fused, and
m is an integer of 1 to 3.

2. The polymer as claimed in claim 1, wherein $Ar^1$ and $Ar^2$ are independently a substituted or unsubstituted C10 to C30 fused aromatic ring group in which at least two rings are fused.

3. The polymer as claimed in claim 2, wherein $Ar^1$ and $Ar^2$ are independently a substituted or unsubstituted C14 fused aromatic ring group in which three rings are fused, a substituted or unsubstituted C16 to C18 fused aromatic ring group in which four rings are fused, or a combination thereof.

4. The polymer as claimed in claim 1, wherein the first compound is unsubstituted or is substituted with a hydroxy group or a C1 to C5 alkoxy group.

5. The polymer as claimed in claim 1, wherein n1 and n2 are both 1.

6. The polymer as claimed in claim 1, wherein the first compound is represented by Chemical Formula 1-1 or Chemical Formula 1-2:

[Chemical Formula 1-1]

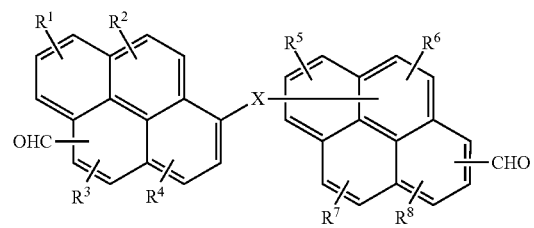

[Chemical Formula 1-2]

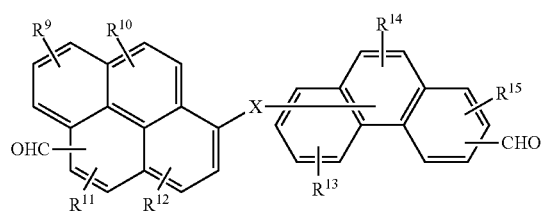

wherein, in Chemical Formula 1-1 and 1-2,
X is O, S, or NR, in which R is a hydrogen, or a substituted or unsubstituted C1 to C30 alkyl group, and
$R^1$ to $R^{15}$ are independently hydrogen, a hydroxy group, or a C1 to C5 alkoxy group.

7. The polymer as claimed in claim 1, wherein the first compound is a compound of Group 1:

[Group 1]

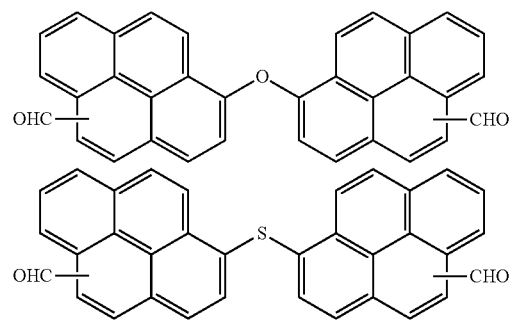

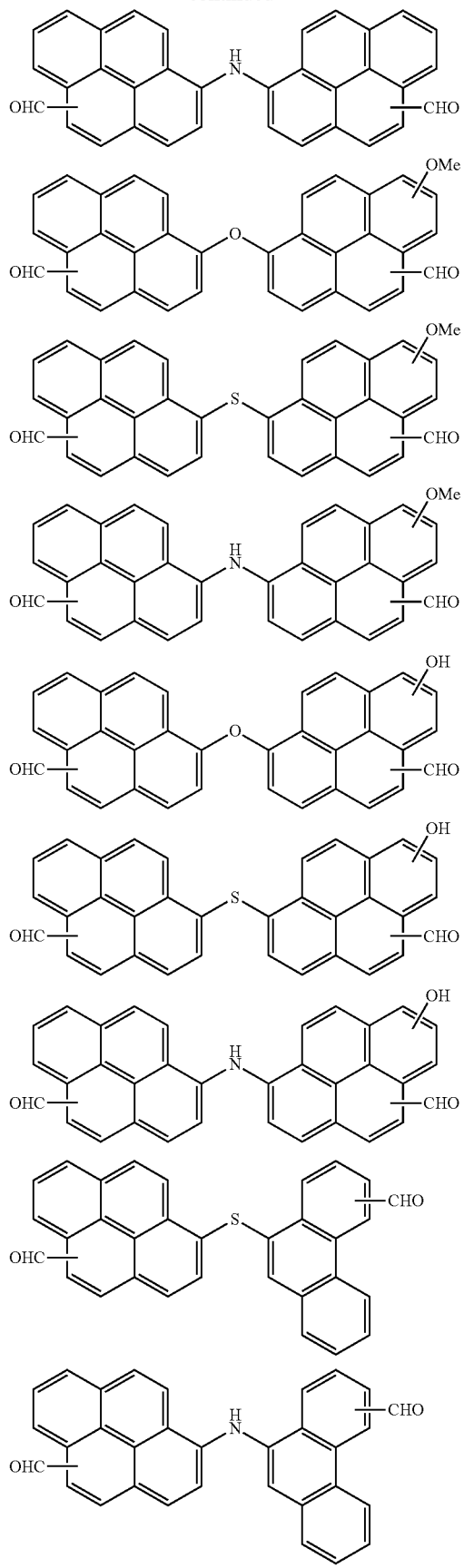

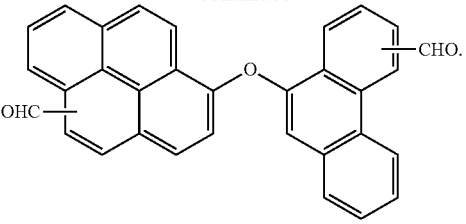

8. The polymer as claimed in claim 1, wherein $Ar^3$ is a substituted or unsubstituted naphthyl group, a substituted or unsubstituted anthracenyl group, a substituted or unsubstituted phenanthrenyl group, a substituted or unsubstituted triphenylene group, a substituted or unsubstituted pyrenyl group, or a combination thereof.

9. The polymer as claimed in claim 1, wherein a weight average molecular weight of the polymer is about 1,500 to about 4,000.

10. An organic layer composition, comprising:
the polymer as claimed in claim 1, and
a solvent.

11. The organic layer composition as claimed in claim 10, wherein $Ar^1$ and $Ar^2$ are independently a substituted or unsubstituted C10 to C30 fused aromatic ring group in which at least two rings are fused.

12. The organic layer composition as claimed in claim 11, wherein $Ar^1$ and $Ar^2$ are independently a substituted or unsubstituted C14 fused aromatic ring group in which three rings are fused, a substituted or unsubstituted C16 to C18 fused aromatic ring group in which four rings are fused, or a combination thereof.

13. The organic layer composition as claimed in claim 10, wherein the first compound is unsubstituted or is substituted with a hydroxy group or a C1 to C5 alkoxy group.

14. The organic layer composition as claimed in claim 10, wherein n1 and n2 are both 1.

15. The organic layer composition as claimed in claim 10, wherein the first compound is represented by Chemical Formula 1-1 or Chemical Formula 1-2:

[Chemical Formula 1-1]

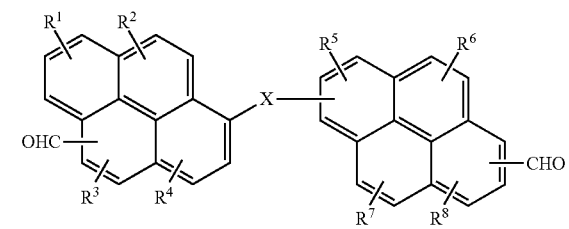

[Chemical Formula 1-2]

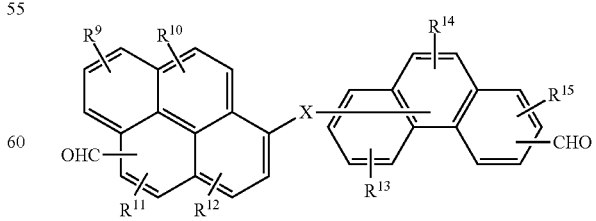

wherein, in Chemical Formula 1-1 and 1-2,
X is O, S, or NR, in which R is a hydrogen, or a substituted or unsubstituted C1 to C30 alkyl group, and $R^1$ to $R^{15}$ are independently hydrogen, a hydroxy group, or a C1 to C5 alkoxy group.

16. The organic layer composition as claimed in claim 10, wherein the first compound is a compound of Group 1:

[Group 1]

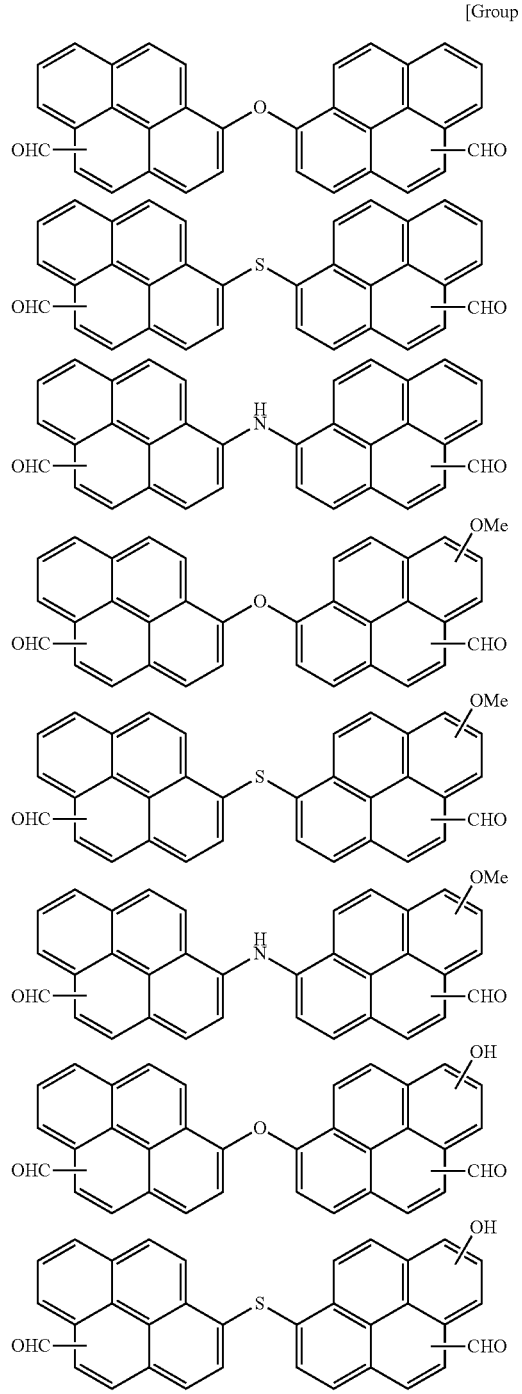

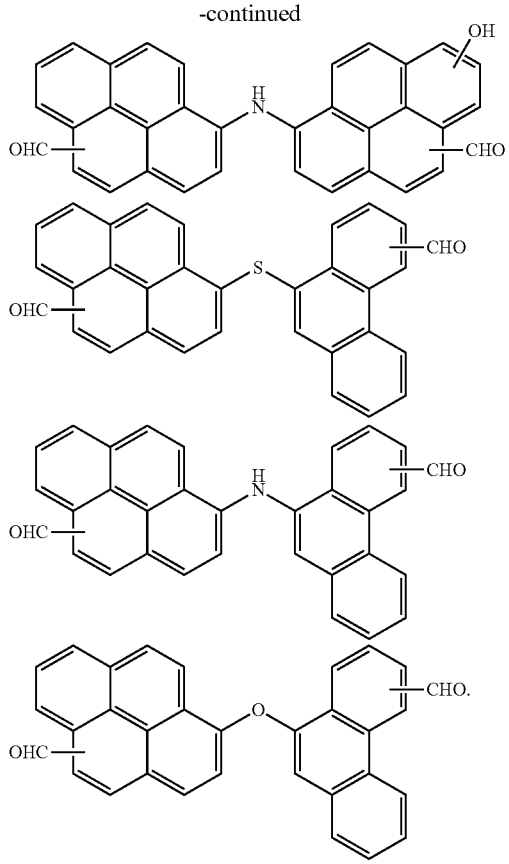

17. The organic layer composition as claimed in claim 10, wherein $Ar^3$ is a substituted or unsubstituted naphthyl group, a substituted or unsubstituted anthracenyl group, a substituted or unsubstituted phenanthrenyl group, a substituted or unsubstituted triphenylene group, a substituted or unsubstituted pyrenyl group, or a combination thereof.

18. The organic layer composition as claimed in claim 10, wherein a weight average molecular weight of the polymer is about 1,500 to about 4,000.

19. A method of forming patterns, the method comprising:
providing a material layer on a substrate,
applying the organic layer composition as claimed in claim 10 on the material layer,
heat-treating the organic layer composition to form a hardmask layer,
forming a photoresist layer on the hardmask layer,
exposing and developing the photoresist layer to form a photoresist pattern,
selectively removing the hardmask layer using the photoresist pattern to expose a part of the material layer, and
etching an exposed part of the material layer.

\* \* \* \* \*